United States Patent
Kishida et al.

(10) Patent No.: US 11,735,904 B2
(45) Date of Patent: *Aug. 22, 2023

(54) CUT-OFF CIRCUIT DIAGNOSTIC DEVICE

(71) Applicant: Panasonic Intellectual Property Management Co., Ltd., Osaka (JP)

(72) Inventors: Hideyuki Kishida, Osaka (JP); Taro Kishibe, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 295 days.

This patent is subject to a terminal disclaimer.

(21) Appl. No.: 15/734,987

(22) PCT Filed: May 10, 2019

(86) PCT No.: PCT/JP2019/018654
§ 371 (c)(1),
(2) Date: Dec. 3, 2020

(87) PCT Pub. No.: WO2019/239753
PCT Pub. Date: Dec. 19, 2019

(65) Prior Publication Data
US 2021/0234364 A1    Jul. 29, 2021

(30) Foreign Application Priority Data
Jun. 15, 2018 (JP) .................. 2018-114678

(51) Int. Cl.
| | | |
|---|---|---|
| *H02H 7/08* | (2006.01) | |
| *G05B 9/02* | (2006.01) | |
| *H02P 27/08* | (2006.01) | |
| *H02P 29/024* | (2016.01) | |
| *G01R 31/327* | (2006.01) | |

(52) U.S. Cl.
CPC ....... *H02H 7/0844* (2013.01); *G01R 31/3275* (2013.01); *G05B 9/02* (2013.01); *H02P 27/08* (2013.01); *H02P 29/024* (2013.01)

(58) Field of Classification Search
CPC .... H02H 7/0844; G01R 31/3275; G05B 9/02; H02P 27/08; H02P 29/024
See application file for complete search history.

(56) References Cited

U.S. PATENT DOCUMENTS

| | | | |
|---|---|---|---|
| 11,293,997 B2 * | 4/2022 | Kishibe .................. | G01R 31/56 |
| 2006/0214618 A1 | 9/2006 | Hashimoto et al. | |

(Continued)

FOREIGN PATENT DOCUMENTS

| | | |
|---|---|---|
| EP | 2367278 A2 | 9/2011 |
| EP | 3327883 | 5/2018 |

(Continued)

OTHER PUBLICATIONS

The Extended European Search Report dated Jun. 21, 2021, issued in counterpart EP Application No. 19818510.0. (9 pages).

(Continued)

*Primary Examiner* — Jeff W Natalini
(74) *Attorney, Agent, or Firm* — WHDA, LLP

(57) ABSTRACT

A cut-off circuit diagnostic device includes a motor control module that controls a motor, and an external safety module that is detachably attached to the motor control module. The motor control module includes: a motor drive unit that has an inverter circuit for controlling a voltage applied to the motor by pulse width modulation control and a drive circuit for driving a power element of the inverter circuit; a cut-off circuit that cuts off power supply to the drive circuit; and a first cut-off circuit diagnostic unit that has a first diagnosis pulse generator for generating a first signal to control the cut-off by the cut-off circuit and that detects whether or not the power supply to the drive circuit is cut off according to the first signal. The external safety module includes a second cut-off circuit diagnostic unit that has a second diagnosis pulse generator for generating a second signal to control the cut-off by the cut-off circuit and that detects whether or not (Continued)

the power supply to the drive circuit is cut off according to the second signal. The motor control module further includes a function switching unit that supplies the second signal to the cut-off circuit when the external safety module is attached to the motor control module, and supplies the first signal to the cut-off circuit when the external safety module is not attached to the motor control module.

6 Claims, 5 Drawing Sheets

(56) References Cited

U.S. PATENT DOCUMENTS

| | | | |
|---|---|---|---|
| 2011/0199035 A1 | 8/2011 | Ooto et al. | |
| 2015/0314432 A1* | 11/2015 | Yang | B25C 1/06 227/8 |
| 2016/0241174 A1 | 8/2016 | Hisamatsu et al. | |
| 2019/0226450 A1* | 7/2019 | Theopold | G05B 19/048 |
| 2019/0363650 A1* | 11/2019 | Hashimoto | H02P 3/18 |

FOREIGN PATENT DOCUMENTS

| | | | |
|---|---|---|---|
| EP | 3633465 A1 | 4/2020 | |
| JP | 4202335 B | 12/2008 | |
| JP | 2010-104187 | 5/2010 | |
| JP | 5429181 B | 2/2014 | |
| JP | PCT/JP2018/015783 | * 12/2018 | G05B 9/02 |
| WO | 2015/063892 | 5/2015 | |
| WO | 2017/013722 | 1/2017 | |

OTHER PUBLICATIONS

International Search Report of PCT application No. PCT/JP2019/018654 dated Aug. 13, 2019.

* cited by examiner

CUT-OFF CIRCUIT DIAGNOSTIC DEVICE

TECHNICAL FIELD

The present invention relates to a cut-off circuit diagnostic device for diagnosing a cut-off circuit that cuts off the supply of electric power to a motor.

BACKGROUND ART

In order to ensure the safety of people and goods in a production line of a production factory, the operation of the production line may be stopped when an anomaly signal from a sensor is detected. This method has a disadvantage that productivity is reduced due to the operation of the production line being stopped. On the other hand, there is a method in which a safety module built into a system that controls a motor monitors values of parameters such as position, speed, and torque in the motor control, and stops the motor according to a predetermined threshold, or continues to drive the motor within a permissible range. When the safety module determines that the motor needs to be stopped, the safety module cuts off the supply of power to the motor using a cut-off circuit inside a motor control module, and therefore, a diagnosis for diagnosing whether the cut-off circuit normally operates is demanded.

As a method for diagnosing a cut-off circuit, a technique has been proposed in which a diagnosis pulse is input to the cut-off circuit, and a feedback signal in response to the diagnosis pulse is checked to diagnose the cut-off circuit (for example, refer to FIG. 5 of PTL 1). FIG. 5 is a block diagram showing a configuration of a conventional cut-off circuit diagnostic device.

In the configuration of the conventional cut-off circuit diagnostic device, a cut-off circuit and a diagnosis circuit for the cut-off circuit are in the same module, and therefore, the entire path of the cut-off circuit may not unfortunately be diagnosed.

CITATION LIST

Patent Literature

PTL 1: Japanese Patent No. 4202335

SUMMARY OF THE INVENTION

A cut-off circuit diagnostic device according to an aspect of the present disclosure includes a motor control module that controls a motor, and an external safety module that is detachably attached to the motor control module. The motor control module includes: a motor drive unit that has an inverter circuit for controlling a voltage applied to the motor by pulse width modulation (PWM) control and a drive circuit for driving a power element of the inverter circuit; a cut-off circuit that cuts off power supply to the drive circuit; and a first cut-off circuit diagnostic unit that has a first diagnosis pulse generator for generating a first signal to control the cut-off by the cut-off circuit and that detects whether or not the power supply to the drive circuit is cut off according to the first signal. The external safety module includes a second cut-off circuit diagnostic unit that has a second diagnosis pulse generator for generating a second signal to control the cut-off by the cut-off circuit and that detects whether or not the power supply to the drive circuit is cut off according to the second signal. The motor control module further includes a function switching unit that supplies the second signal to the cut-off circuit when the external safety module is attached to the motor control module, and supplies the first signal to the cut-off circuit when the external safety module is not attached to the motor control module.

According to the cut-off circuit diagnostic device of one aspect of the present disclosure, the entire path of the cut-off circuit can be diagnosed using a circuit in a module different from the module in the cut-off circuit.

DESCRIPTION OF EMBODIMENTS

A specific example of a cut-off circuit diagnostic device according to an aspect of the present disclosure will now be described with reference to the drawings.

It should be noted that the exemplary embodiments described below provide a preferred specific example of the present disclosure. Numerical values, shapes, materials, constituent elements, arrangement positions and connection modes of the constituent elements, steps, and order of the steps, for example, illustrated in the following exemplary embodiments are merely examples, and therefore are not intended to limit the present invention. The present invention is limited only by the claims. Therefore, among constituent elements in the following exemplary embodiment, constituent elements that are not recited in any one of the independent claims indicating the most generic concepts of the present invention are not necessarily essential for achievement of the object of the present invention but are described as preferable components.

First Exemplary Embodiment

A cut-off circuit diagnostic device according to a first exemplary embodiment will be described with reference to the drawings.

Figure 1:
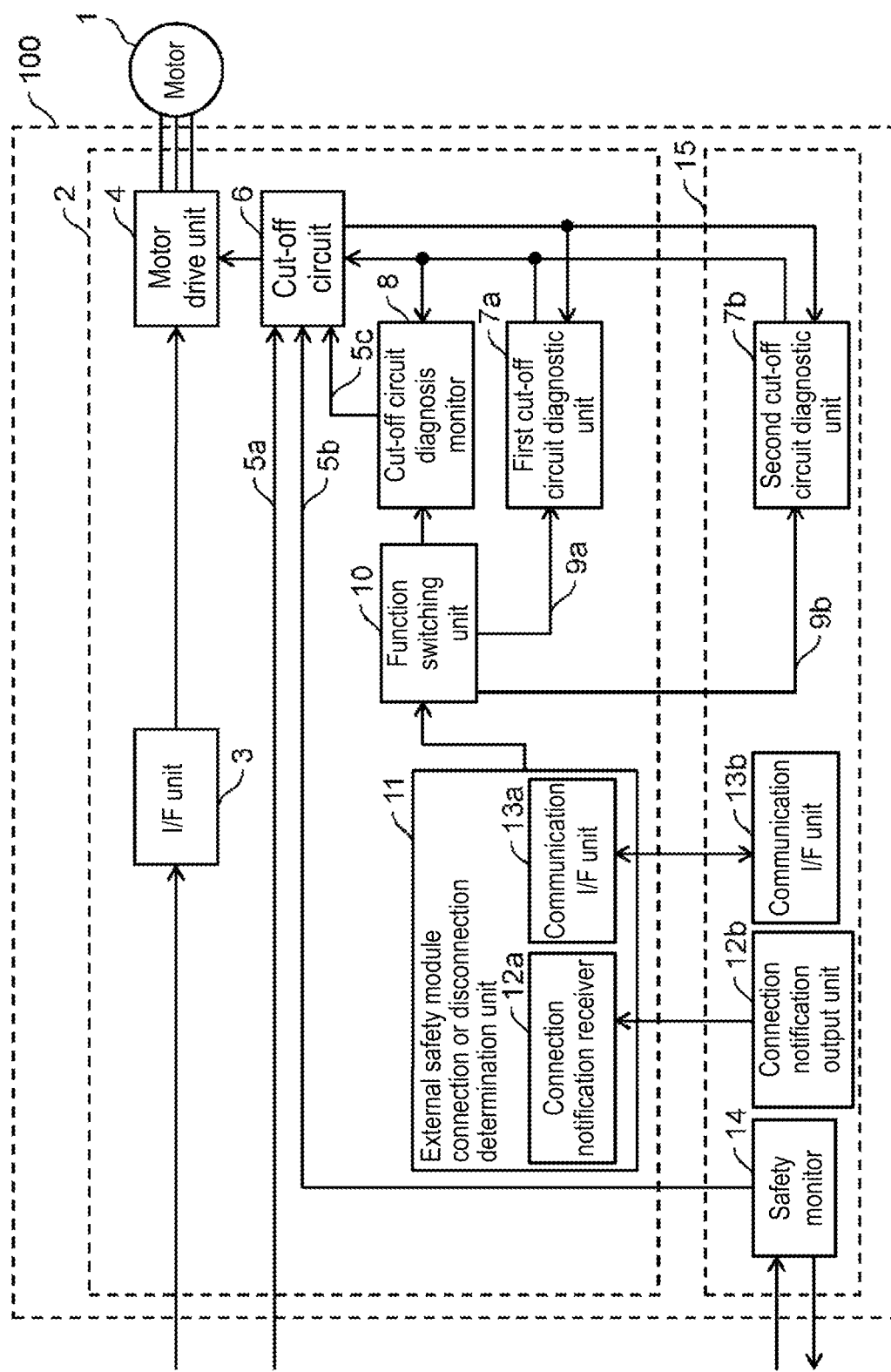
FIG. 1 is a block diagram showing a configuration of a cut-off circuit diagnostic device according to a first exemplary embodiment.
Figure 2:
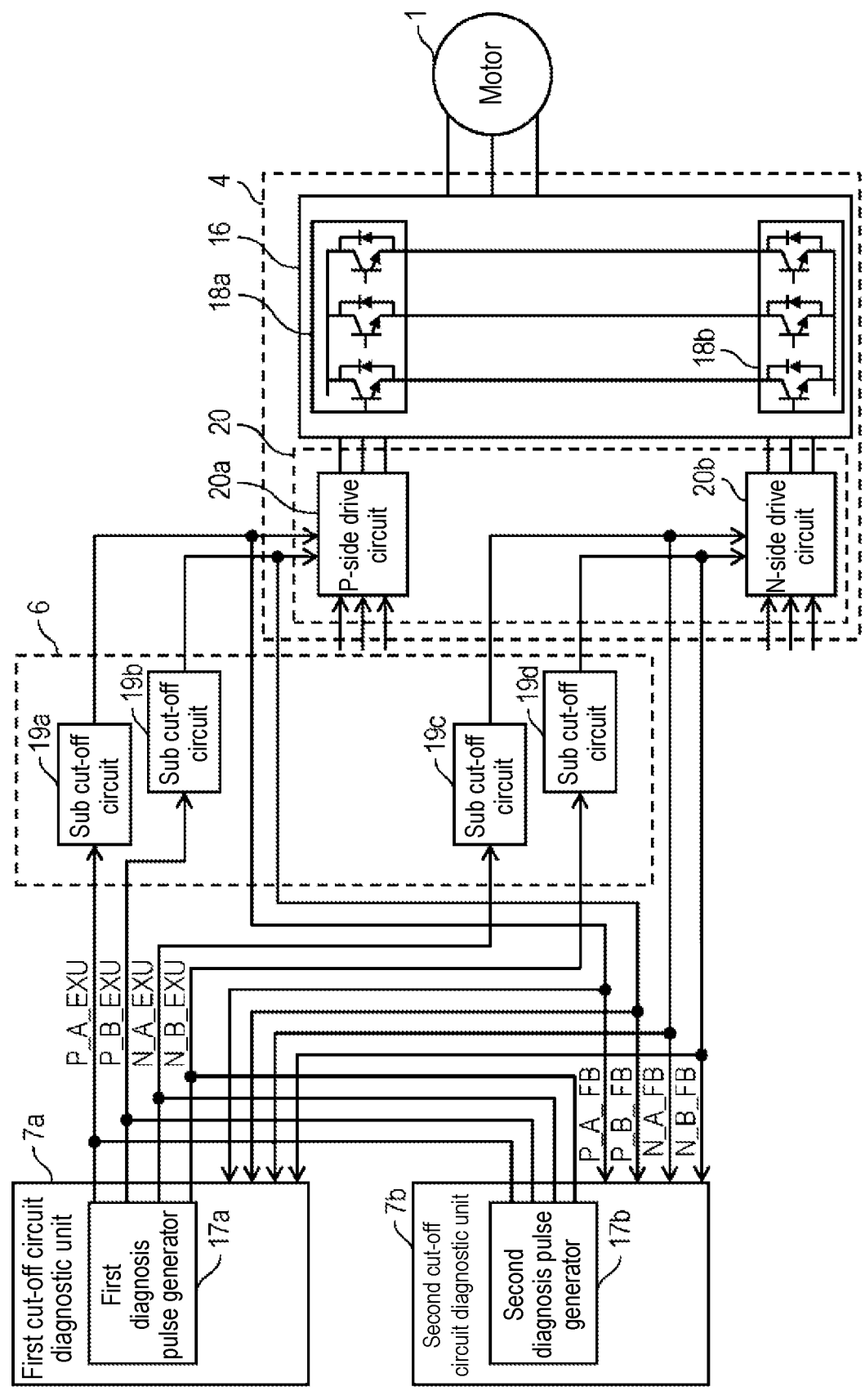
FIG. 2 is a diagram showing configurations of a motor drive unit, a cut-off circuit, a first cut-off circuit diagnostic unit, and a second cut-off circuit diagnostic unit in the cut-off circuit diagnostic device according to the first exemplary embodiment.

FIG. 1 is a block diagram showing a configuration of cut-off circuit diagnostic device 100 according to the first exemplary embodiment. FIG. 2 is a diagram showing configurations of motor drive unit 4, cut-off circuit 6, first cut-off circuit diagnostic unit 7a, and second cut-off circuit diagnostic unit 7b in the cut-off circuit diagnostic device according to the first exemplary embodiment.

As shown in FIG. 1, cut-off circuit diagnostic device 100 includes motor control module 2 and external safety module 15.

Motor 1 is, for example, an induction motor that rotates when a three-phase sine wave is applied, or a three-phase brushless motor having a magnet disposed on a rotor.

Motor control module 2 includes interface unit (I/F unit) 3, motor drive unit 4, cut-off circuit 6, first cut-off circuit diagnostic unit 7a, cut-off circuit diagnosis monitor 8, function switching unit 10, and external safety module connection or disconnection determination unit 11. Motor control module 2 controls motor 1.

External safety module 15 can be attached to and detached from motor control module 2. External safety module 15 includes second cut-off circuit diagnostic unit 7b, safety monitor 14, connection notification output unit 12b, and communication interface unit (communication I/F unit) 13b.

Interface unit 3 converts a motor control command signal input from an external device (for example, a motor controller) into a command value, and outputs the command value to motor drive unit 4.

Motor drive unit 4 controls motor 1 by pulse width modulation (PWM) according to the command value input from interface unit 3. Motor drive unit 4 includes inverter circuit 16 (see FIG. 2) that controls a voltage applied to motor 1 by PWM control, and drive circuit 20 (see FIG. 2) that drives a power element of the inverter circuit. Motor drive unit 4 will be described later in more detail with reference to FIG. 2.

Cut-off circuit 6 cuts off the power supply to drive circuit 20. Cut-off circuit 6 cuts off the power supply to drive circuit 20 when an emergency stop signal (it is assumed here that the emergency stop signal includes three signals which are emergency stop signal 5a, emergency stop signal 5b, and emergency stop signal 5c, but the emergency stop signal may include four or more signals) is input. Here, emergency stop signal 5a is a signal output from an external device of motor control module 2. Emergency stop signal 5b is a signal output from safety monitor 14 described later. Emergency stop signal 5c is a signal output from cut-off circuit diagnosis monitor 8 described later. Cut-off circuit 6 controls cut-off of power supply to drive circuit 20 in accordance with a first signal and a second signal described later. Cut-off circuit 6 will be described later in more detail with reference to FIG. 2.

First cut-off circuit diagnostic unit 7a includes first diagnosis pulse generator 17a which generates a first signal that controls cut-off of power supply to drive circuit 20 by cut-off circuit 6. First cut-off circuit diagnostic unit 7a detects whether or not the power supply to drive circuit 20 is cut off according to the first signal.

Second cut-off circuit diagnostic unit 7b includes second diagnosis pulse generator 17b which generates a second signal that controls cut-off of power supply to drive circuit 20 by cut-off circuit 6. Second cut-off circuit diagnostic unit 7b detects whether or not the power supply to drive circuit 20 is cut off according to the second signal.

Hereinafter, when it is not necessary to intentionally distinguish the first signal and the second signal, the first signal and the second signal may sometimes be collectively referred to as a diagnosis pulse signal.

Cut-off circuit diagnosis monitor 8 detects an anomaly of the first signal and an anomaly of the second signal. When detecting the anomaly of the first signal or the anomaly of the second signal, cut-off circuit diagnosis monitor 8 outputs emergency stop signal 5c for cutting off the power supply to drive circuit 20 to cut-off circuit 6.

External safety module connection or disconnection determination unit 11 determines whether or not external safety module 15 is attached to motor control module 2. External safety module connection or disconnection determination unit 11 includes connection notification receiver 12a and communication interface unit (communication I/F unit) 13a. Connection notification receiver 12a receives a connection notification signal transmitted from external safety module 15 when external safety module 15 is attached to motor control module 2, and determines whether or not external safety module 15 is attached to motor control module 2 on the basis of whether or not the connection notification signal is received. Communication interface unit 13a can communicate with external safety module 15 when external safety module 15 is attached to motor control module 2, and determines whether or not external safety module 15 is attached to motor control module 2 on the basis of whether or not there is communication with external safety module 15.

Note that connection notification receiver 12a may output, for example, a signal that expresses whether or not external safety module 15 is attached to motor control module 2 with binary or multiple values.

In the following description, external safety module connection or disconnection determination unit 11 includes both connection notification receiver 12a and communication interface unit 13a. However, external safety module connection or disconnection determination unit 11 may include at least one of connection notification receiver 12a and communication interface unit 13a.

Function switching unit 10 supplies the second signal to cut-off circuit 6 when external safety module 15 is attached to motor control module 2, and supplies the first signal to cut-off circuit 6 when external safety module 15 is not attached to motor control module 2. More specifically, on the basis of determination of whether or not external safety module 15 is attached to motor control module 2 by external safety module connection or disconnection determination unit 11, function switching unit 10 outputs diagnosis execution control signal 9b to second cut-off circuit diagnostic unit 7b to cause second cut-off circuit diagnostic unit 7b to output the second signal to cut-off circuit 6, when the determination is positive. When the determination is negative, function switching unit 10 outputs, to first cut-off circuit diagnostic unit 7a, diagnosis execution control signal 9a to cause first cut-off circuit diagnostic unit 7a to output the first signal to cut-off circuit 6.

Connection notification output unit 12b outputs a connection notification signal. Connection notification output unit 12b may periodically output the connection notification signal, for example. The connection notification signal is received by connection notification receiver 12a when external safety module 15 is attached to motor control module 2.

Communication interface unit 13b can communicate with communication interface unit 13a when external safety module 15 is attached to motor control module 2.

Safety monitor 14 outputs emergency stop signal 5b to cut-off circuit 6 to cut off the power supply to drive circuit 20, when the operation command to motor 1 is outside a predetermined allowable range. Safety monitor 14 monitors, for example, values of parameters such as position, speed, and torque input from the outside, and outputs the emergency stop signal when the monitored target is outside a predetermined allowable range.

Next, motor drive unit 4, cut-off circuit 6, first cut-off circuit diagnostic unit 7a, and second cut-off circuit diagnostic unit 7b will be described in more detail with reference to FIG. 2.

In the present exemplary embodiment, inverter circuit 16 is a three-phase inverter circuit, and has six power elements, as shown in FIG. 2. Inverter circuit 16 includes P-side power element 18a which is connected to the positive side (P side) of a main power supply voltage and controlled by P-side drive circuit 20a, and N-side power element 18b which is connected to the negative side (N side) of the main power supply voltage and controlled by N-side drive circuit 20b.

Cut-off circuit 6 includes sub cut-off circuit 19a, sub cut-off circuit 19b, sub cut-off circuit 19c, and sub cut-off circuit 19d.

Figure 3:
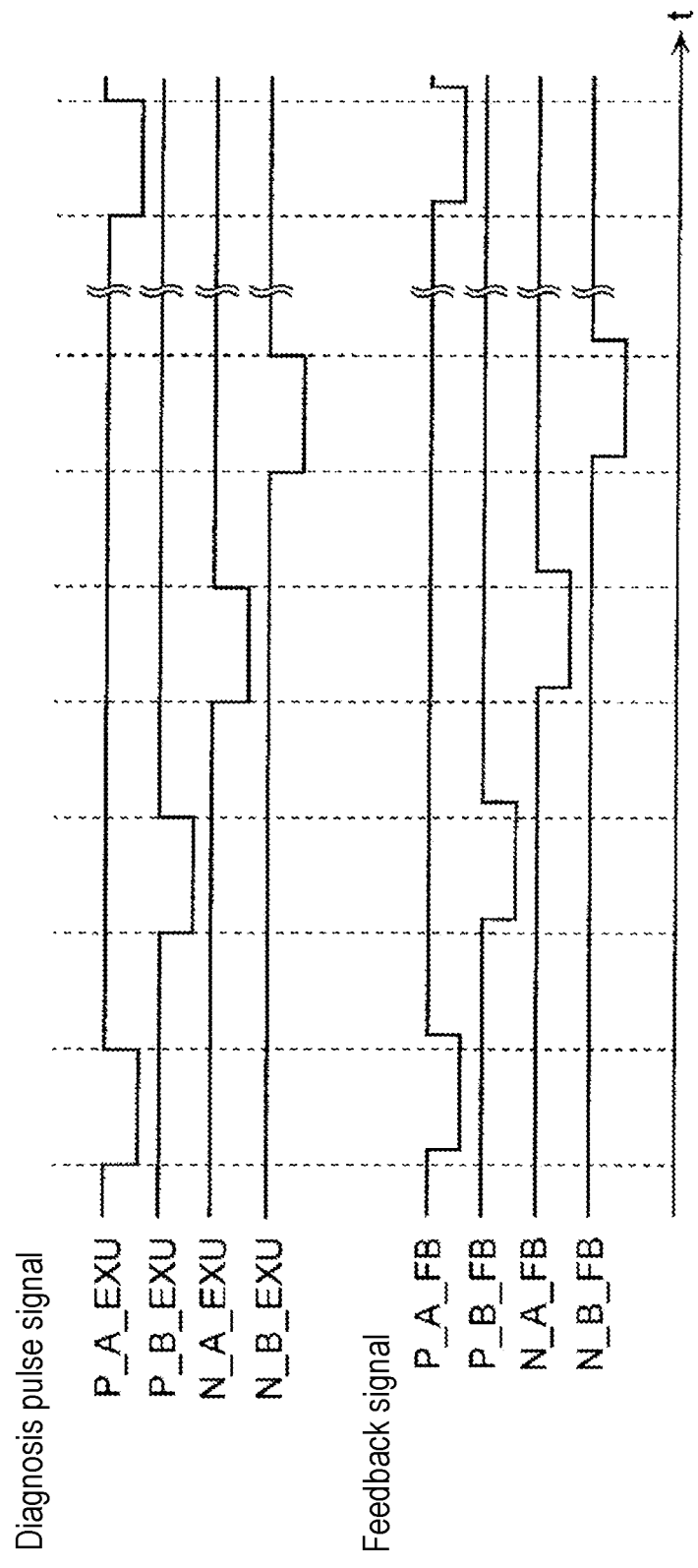
FIG. 3 is a timing chart showing diagnosis pulse signals output from the first cut-off circuit diagnostic unit or the second cut-off circuit diagnostic unit of the cut-off circuit diagnostic device according to the first exemplary embodiment and feedback signals output from the cut-off circuit in response to the diagnosis pulse signals.

FIG. 3 is a timing chart of diagnosis pulse signals (P_A_EXU, P_B_EXU, N_A_EXU, and N_B_EXU in FIG. 3) output from first cut-off circuit diagnostic unit 7a or second cut-off circuit diagnostic unit 7b of the cut-off circuit diagnostic device according to the first exemplary embodiment, and feedback signals (P_A_FB, P_B_FB, N_A_FB, and N_B_FB in FIG. 3) output from cut-off circuit 6 in response to the diagnosis pulse signals.

As shown in FIG. 3, first diagnosis pulse generator 17a and second diagnosis pulse generator 17b output the diagnosis pulse signals in such a way that the diagnosis pulse signals are pulsed at different timings. In this way, first diagnosis pulse generator 17a and second diagnosis pulse generator 17b output diagnosis pulse signals to sub cut-off circuit 19a and sub cut-off circuit 19b, respectively, in such a way that the diagnosis pulse signals are not simultaneously pulsed. Further, first diagnosis pulse generator 17a and second diagnosis pulse generator 17b output diagnosis pulse signals to sub cut-off circuit 19c and sub cut-off circuit 19d, respectively, in such a way that the diagnosis pulse signals are not simultaneously pulsed.

The power supply to drive circuit 20 is cut off when signals having the same polarity as the diagnosis pulse signals are simultaneously output to at least one of a combination of sub cut-off circuit 19a and sub cut-off circuit 19b and a combination of sub cut-off circuit 19c and sub cut-off circuit 19d.

First cut-off circuit diagnostic unit 7a and second cut-off circuit diagnostic unit 7b receive the feedback signals output from cut-off circuit 6 in response to the output diagnosis pulse signals, and thereby detects whether or not the power supply to drive circuit 20 is cut off according to the diagnosis pulse signals.

For example, when first diagnosis pulse generator 17a or second diagnosis pulse generator 17b outputs a pulsed diagnosis pulse signal to sub cut-off circuit 19a, first cut-off circuit diagnostic unit 7a or second cut-off circuit diagnostic unit 7b receives a feedback signal indicating that an operation power supply output from sub cut-off circuit 19a becomes 0 V or falls below the operating voltage of P-side drive circuit 20a. First cut-off circuit diagnostic unit 7a or second cut-off circuit diagnostic unit 7b confirms that sub cut-off circuit 19a is operating normally on the basis of this result, and then performs the same operation for sub cut-off circuit 19b. In sequence of operations, when first cut-off circuit diagnostic unit 7a or second cut-off circuit diagnostic unit 7b receives a feedback signal indicating that the operation power supply output from sub cut-off circuit 19a is within a range in which P-side drive circuit 20a can operate after first diagnosis pulse generator 17a or second diagnosis pulse generator 17b outputs the diagnosis pulse signal to sub cut-off circuit 19a, first cut-off circuit diagnostic unit 7a or second cut-off circuit diagnostic unit 7b determines that cut-off circuit 6 has an anomaly, outputs cut-off signals to sub cut-off circuits 19a to 19d, and stops the power supply to drive circuit 20.

As described above, cut-off circuit diagnostic device 100 according to the present exemplary embodiment includes motor control module 2 that controls motor 1, and external safety module 15 that is detachably attached to motor control module 2. Motor control module 2 includes: motor drive unit 4 that has inverter circuit 16 for controlling a voltage applied to motor 1 by PWM control and drive circuit 20 for driving a power element of inverter circuit 16; cut-off circuit 6 that cuts off power supply to drive circuit 20; and first cut-off circuit diagnostic unit 7a that has first diagnosis pulse generator 17a for generating a first signal to control the cut-off by cut-off circuit 6 and that detects whether or not the power supply to drive circuit 20 is cut off according to the first signal. External safety module 15 includes second cut-off circuit diagnostic unit 7b that has second diagnosis pulse generator 17b for generating a second signal to control the cut-off by cut-off circuit 6 and that detects whether or not the power supply to drive circuit 20 is cut off according to the second signal. Motor control module 2 further includes a function switching unit that supplies the second signal to cut-off circuit 6 when external safety module 15 is attached to motor control module 2, and supplies the first signal to cut-off circuit 6 when external safety module 15 is not attached to motor control module 2.

With this configuration, the entire path of cut-off circuit 6 can be diagnosed using a circuit in a module different from the module in cut-off circuit 6.

Further, motor control module 2 may further include external safety module connection or disconnection determination unit 11 that determines whether or not external safety module 15 is attached to motor control module 2. On the basis of the determination by external safety module connection or disconnection determination unit 11, function switching unit 10 may supply the second signal to cut-off circuit 6 when the determination is positive, and supply the first signal to cut-off circuit 6 when the determination is negative.

With this configuration, cut-off circuit diagnostic device 100 can continue the diagnosis of cut-off circuit 6 without depending on whether external safety module 15 is attached or detached.

Further, external safety module 15 may further include safety monitor 14 that outputs a first emergency stop signal for cutting off the power supply to drive circuit 20 to cut-off circuit 6 when an operation command to motor 1 is outside a predetermined allowable range.

With this configuration, cut-off circuit diagnostic device 100 can stop motor 1 when the operation command to motor 1 has an anomaly.

In addition, motor control module 2 may further include cut-off circuit diagnosis monitor 8 that detects an anomaly of the first signal and an anomaly of the second signal.

With this configuration, cut-off circuit diagnostic device 100 can stop motor 1 when the first signal or the second signal has an anomaly.

Further, cut-off circuit diagnosis monitor 8 may output, to cut-off circuit 6, a second emergency stop signal for cutting off the power supply to drive circuit 20 when detecting an anomaly of the first signal or an anomaly of the second signal.

With this configuration, cut-off circuit diagnostic device 100 can stop the power supply to drive circuit 20 when the first signal or the second signal has an anomaly.

Further, external safety module connection or disconnection determination unit 11 may include at least one of connection notification receiver 12a and communication interface unit 13b, connection notification receiver 12a receiving a connection notification signal transmitted from external safety module 15 when external safety module 15 is attached to motor control module 2 and performing the determination on the basis of whether the connection notification signal is received, communication interface unit 13b being capable of communicating with external safety module 15 when external safety module 15 is attached to motor control module 2 and performing the determination on the basis of whether or not there is communication with the external safety module.

With this configuration, cut-off circuit diagnostic device 100 can continue the diagnosis of cut-off circuit 6 without depending on whether external safety module 15 is attached or detached.

Second Exemplary Embodiment

Figure 4:
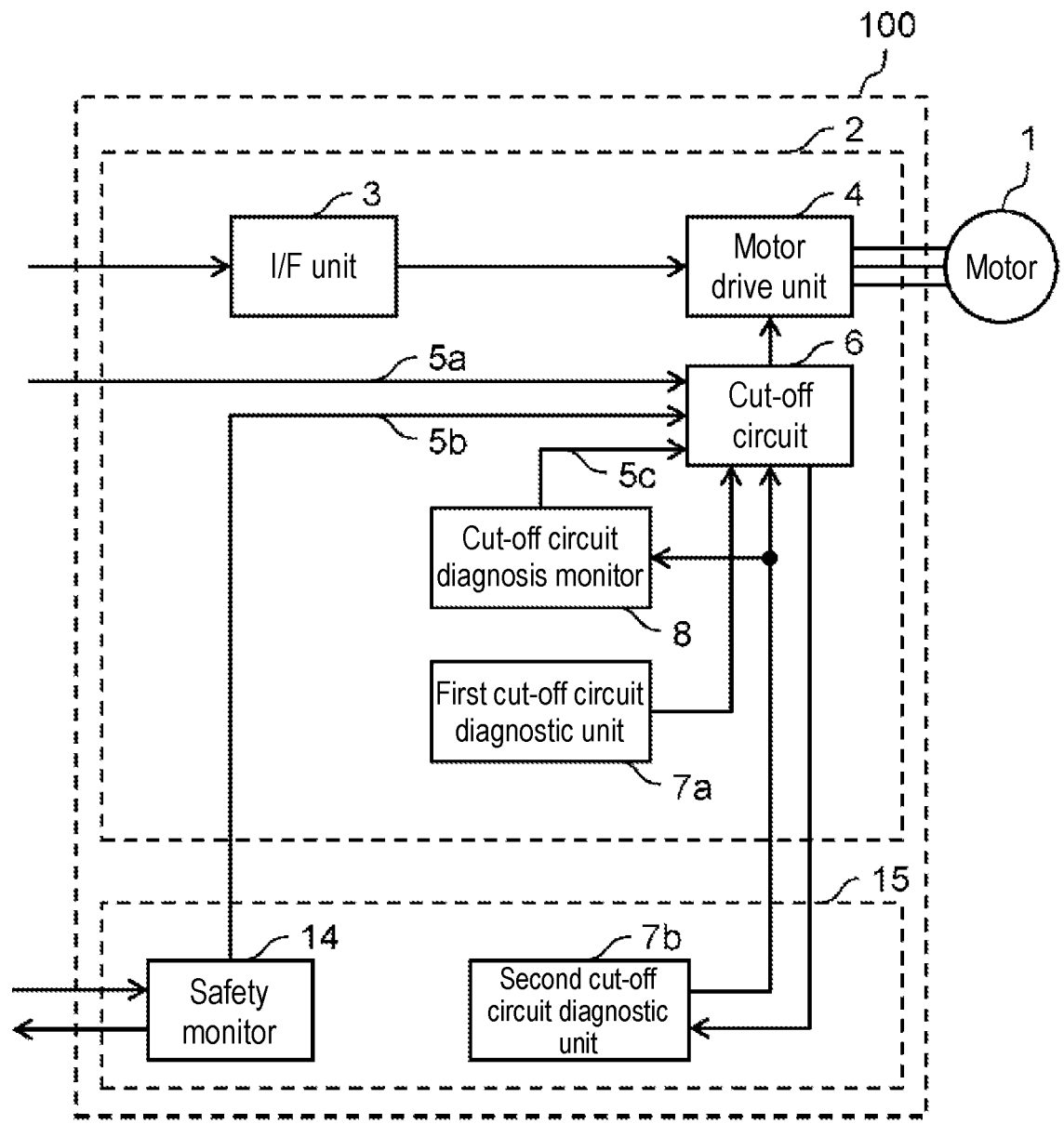
FIG. 4 is a block diagram showing a configuration of a cut-off circuit diagnostic device according to a second exemplary embodiment.
Figure 5:
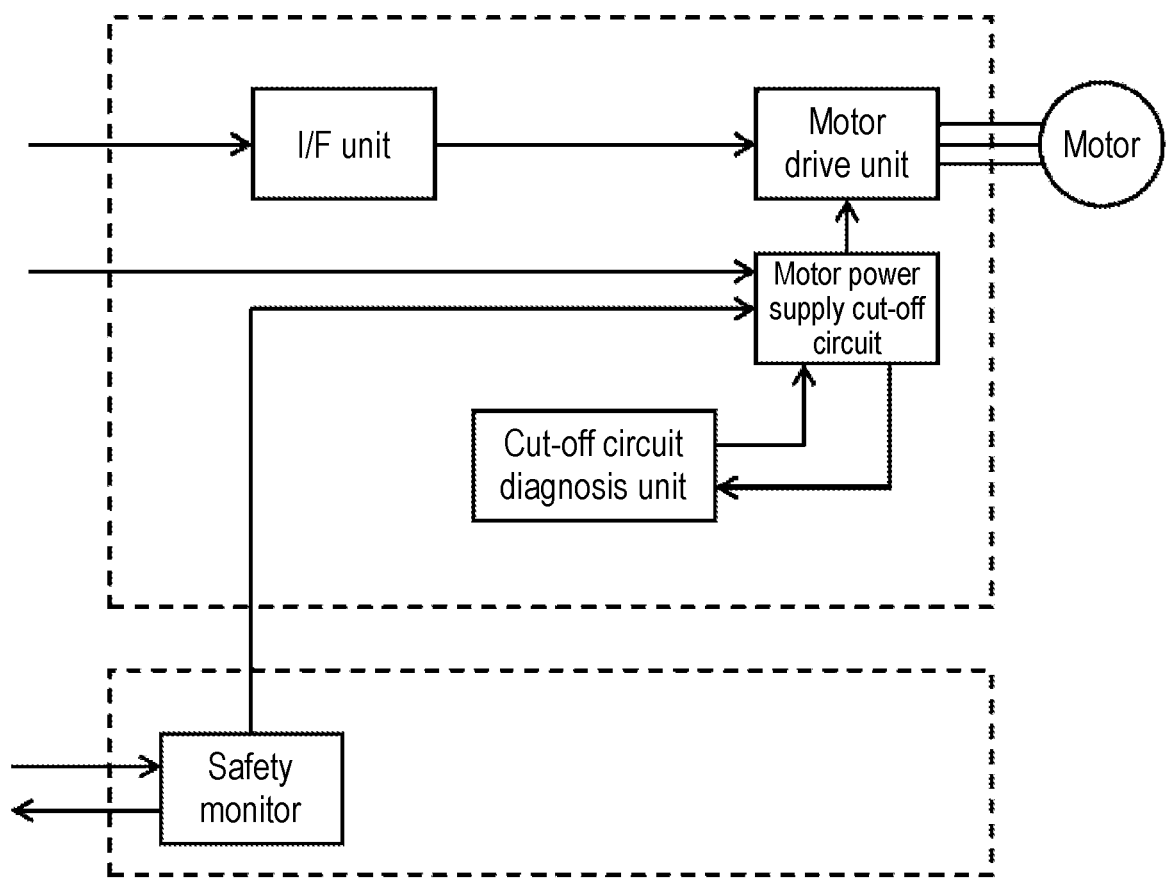
FIG. 5 is a block diagram showing a configuration of a conventional cut-off circuit diagnostic device.

A second exemplary embodiment will be described with reference to FIG. 4. FIG. 4 is a block diagram showing a configuration of a cut-off circuit diagnostic device according to the second exemplary embodiment. The second exemplary embodiment differs from the first exemplary embodiment in that paths of diagnosis pulse signals output from first cut-off circuit diagnostic unit 7a and second cut-off circuit diagnostic unit 7b are separated. The second exemplary embodiment will now be described.

In the first exemplary embodiment, it is not possible to determine which of first cut-off circuit diagnostic unit 7a and second cut-off circuit diagnostic unit 7b has output the diagnosis pulse signal. Cut-off circuit diagnosis monitor 8 in the second exemplary embodiment monitors only the diagnosis pulse signal output from second cut-off circuit diagnostic unit 7b in external safety module 15. Thus, it is possible to specify that the operation of second cut-off circuit diagnostic unit 7b in external safety module 15 has an anomaly. Therefore, the cause of the anomaly can be isolated. Further, a malfunction can be detected which is caused when first cut-off circuit diagnostic unit 7a in motor control module 2 erroneously performs a diagnosis operation without execution of the diagnosis operation by second cut-off circuit diagnostic unit 7b in external safety module 15 in a case where external safety module 15 is attached to motor control module 2.

INDUSTRIAL APPLICABILITY

The present invention can be widely used in devices that utilize a motor.

REFERENCE MARKS IN THE DRAWINGS

1: motor
2: motor control module
3: interface unit
4: motor drive unit
6: cut-off circuit
7a: first cut-off circuit diagnostic unit
7b: second cut-off circuit diagnostic unit
8: cut-off circuit diagnosis monitor
10: function switching unit
11: external safety module connection or disconnection determination unit
12a: connection notification receiver
12b: connection notification output unit
13a: communication interface unit
13b: communication interface unit
14: safety monitor
15: external safety module
16: inverter circuit
17a: first diagnosis pulse generator
17b: second diagnosis pulse generator
18a: P-side power element
18b: N-side power element
20: drive circuit
100: cut-off circuit diagnostic device

The invention claimed is:

1. A cut-off circuit diagnostic device comprising:
a motor control module that controls a motor; and
an external safety module that is detachably attached to the motor control module, wherein
the motor control module includes
a motor drive unit that has an inverter circuit for controlling a voltage applied to the motor by pulse width modulation control and a drive circuit for driving a power element of the inverter circuit,
a cut-off circuit that cuts off power supply to the drive circuit, and
a first cut-off circuit diagnostic unit that has a first diagnosis pulse generator for generating a first signal to control the cut-off by the cut-off circuit and that detects whether or not the power supply to the drive circuit is cut off according to the first signal,
the external safety module includes a second cut-off circuit diagnostic unit that has a second diagnosis pulse generator for generating a second signal to control the cut-off by the cut-off circuit and that detects whether or not the power supply to the drive circuit is cut off according to the second signal, and
the motor control module further includes a function switching unit that supplies the second signal to the cut-off circuit when the external safety module is attached to the motor control module, and supplies the first signal to the cut-off circuit when the external safety module is not attached to the motor control module.

2. The cut-off circuit diagnostic device according to claim 1, further comprising an external safety module connection or disconnection determination unit that determines whether or not the external safety module is attached to the motor control module,
wherein, based on the determination by the external safety module connection or disconnection determination unit, the function switching unit supplies the second signal to the cut-off circuit when the determination is positive meaning that the external safety module is attached, and supplies the first signal to the cut-off circuit when the determination is negative meaning that the external safety module is not attached.

3. The cut-off circuit diagnostic device according to claim 2, wherein the external safety module connection or disconnection determination unit includes at least one of a connection notification receiver and a communication interface unit, the connection notification receiver receiving a connection notification signal transmitted from the external safety module when the external safety module is attached to the motor control module and performing the determination based on whether the connection notification signal is received, the communication interface unit being capable of communicating with the external safety module when the external safety module is attached to the motor control module and performing the determination based on whether or not there is communication with the external safety module.

4. The cut-off circuit diagnostic device according to claim 1, wherein the external safety module further includes a safety monitor that outputs a first emergency stop signal for cutting off the power supply to the drive circuit to the cut-off circuit when an operation command to the motor is outside a predetermined allowable range.

5. The cut-off circuit diagnostic device according to claim 1, wherein the motor control module further includes a cut-off circuit diagnosis monitor that detects an anomaly of the first signal and an anomaly of the second signal.

6. The cut-off circuit diagnostic device according to claim 5, wherein the cut-off circuit diagnosis monitor outputs, to the cut-off circuit, a second emergency stop signal for cutting off the power supply to the drive circuit when detecting the anomaly of the first signal or the anomaly of the second signal.

* * * * *